United States Patent
Kato

(10) Patent No.: US 12,444,701 B2
(45) Date of Patent: Oct. 14, 2025

(54) SEMICONDUCTOR DEVICE WITH FIXED RESISTANCE AND VARIABLE RESISTANCE ELEMENTS

(71) Applicant: ABLIC Inc., Tokyo (JP)

(72) Inventor: Shinjiro Kato, Tokyo (JP)

(73) Assignee: ABLIC Inc., Nagano (JP)

( * ) Notice: Subject to any disclaimer, the term of this patent is extended or adjusted under 35 U.S.C. 154(b) by 324 days.

(21) Appl. No.: 18/185,385

(22) Filed: Mar. 17, 2023

(65) Prior Publication Data

US 2023/0317643 A1   Oct. 5, 2023

(30) Foreign Application Priority Data

Mar. 29, 2022   (JP) .................. 2022-053127

(51) Int. Cl.
H01L 23/64 (2006.01)
H10D 1/47 (2025.01)
H10D 84/00 (2025.01)

(52) U.S. Cl.
CPC ............. *H01L 23/647* (2013.01); *H10D 1/47* (2025.01); *H10D 84/209* (2025.01)

(58) Field of Classification Search
CPC ..................................................... H01L 23/647
USPC ......................................................... 257/538
See application file for complete search history.

(56) References Cited

U.S. PATENT DOCUMENTS 6,369,409 B1   4/2002   Takasu et al.
2018/0269270 A1*   9/2018   Hasegawa ................ H10D 1/47

FOREIGN PATENT DOCUMENTS

JP   H09321229   12/1997
JP   2018152545   9/2018

* cited by examiner

*Primary Examiner* — Ajay Arora
(74) *Attorney, Agent, or Firm* — JCIPRNET

(57) ABSTRACT

Provided is a semiconductor device. The semiconductor device includes a first circuit that includes a plurality of fixed resistance elements connected in series; a second circuit that includes a plurality of variable resistance elements connected in series and that is connected in series to the first circuit; a first cover portion that is provided on an upper layer side of the first circuit and that covers the first circuit; and a second cover portion that is provided on an upper layer side of the second circuit and that covers the second circuit. The first cover portion included two or more first metal films electrically connected, correspondingly, to units having any number of the fixed resistance elements, and the second cover portion includes a second metal film electrically connected to the plurality of the variable resistance elements.

10 Claims, 3 Drawing Sheets

SEMICONDUCTOR DEVICE WITH FIXED RESISTANCE AND VARIABLE RESISTANCE ELEMENTS

CROSS-REFERENCE TO RELATED APPLICATION

This application claims the priority benefits of Japanese application no. 2022-053127, filed on Mar. 29, 2022. The entirety of the above-mentioned patent application is hereby incorporated by reference herein and made a part of this specification.

BACKGROUND

Technical Field

The present invention relates to a semiconductor device.

Related Art

Conventionally, a semiconductor device including a bleeder resistance circuit in which a plurality of polycrystalline silicon resistors are connected in series is commonly used. During the manufacturing process of a bleeder resistance circuit, hydrogen may enter and cause variations in the resistance value of each resistor. To reduce the effect of hydrogen, the resistor is covered with a metal film or the like. However, after the bleeder resistance circuit is manufactured, variations in the resistance value of the resistors may occur due to potential difference between the resistor and the metal film.

Patent Literature 1 (JP 1997-321229) describes a bleeder resistance circuit including a plurality of fixed resistance elements connected in series and a plurality of metal wirings covering the plurality of fixed resistance elements on an upper layer side of the plurality of fixed resistance elements. This bleeder resistance circuit eliminates the potential difference between each fixed resistance element and the metal wiring, and reduces variations in the resistance value of the fixed resistance elements by electrically and individually connecting a plurality of metal wirings that are individually divided to a plurality of fixed resistance elements.

Patent Literature 2 (JP 2018-152545) describes a bleeder resistance circuit including a plurality of fixed resistance elements connected in series; a plurality of first metal wirings covering the plurality of fixed resistance elements on an upper layer side of the plurality of fixed resistance elements; and a second metal wiring covering the plurality of first metal wirings on an upper layer side of the plurality of first metal wirings. This bleeder resistance circuit eliminates the potential difference between each fixed resistance element and the first metal wiring and reduces variations in the resistance value of the fixed resistance elements by electrically and individually connecting a plurality of first metal wirings that are individually divided to a plurality of fixed resistance elements, and electrically connecting a continuous second metal wiring that covers the plurality of first metal wirings on the upper layer side of the plurality of first metal wirings to the plurality of fixed resistance elements.

For the bleeder resistance circuit described in Patent Literature 1, there is a risk that after manufacturing, hydrogen may enter through gaps between metal wirings divided corresponding to all of the fixed resistance elements, causing variations in the resistance value. For the bleeder resistance circuit described in Patent Literature 2, the configuration and manufacturing process may become complicated because a second metal wiring is provided.

SUMMARY

One aspect of the present invention provides a semiconductor device capable of reducing variations in the resistance value that occur in the resistance elements in a bleeder resistance circuit while simplifying the device configuration.

A series-connected semiconductor device according to an aspect of the present invention includes a first circuit that includes a plurality of fixed resistance elements connected in series; a second circuit that includes a plurality of variable resistance elements connected in series and that is connected in series to the first circuit; a first cover portion that is provided on an upper layer side of the first circuit and that covers the first circuit; and a second cover portion that is provided on an upper layer side of the second circuit and that covers the second circuit. The first cover portion includes two or more first metal films electrically connected, correspondingly, to units having any number of the fixed resistance elements, and the second cover portion includes a second metal film electrically connected to the plurality of variable resistance elements.

According to one aspect of the invention, variations in the resistance value that occur in the resistance element in a bleeder resistance circuit can be reduced and the device configuration can be simplified.

DESCRIPTION OF THE EMBODIMENTS

Hereinafter, the semiconductor device according to the embodiments will be described with reference to the drawings. In the following description, a Z axis is defined, a +Z direction is referred to as an upper layer side, and a −Z direction is referred to as a lower layer side, and so on.

Figure 1:
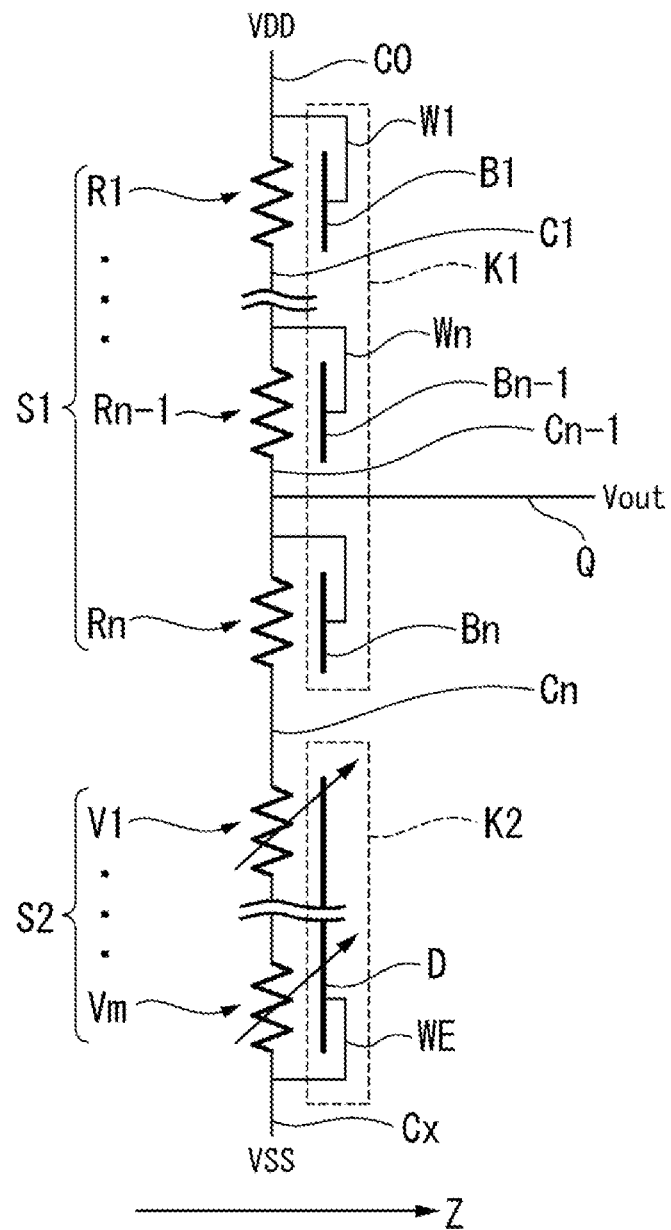
FIG. 1 is a diagram illustrating the configuration of a semiconductor device according to an embodiment.

As shown in FIG. 1, a semiconductor device 1 includes a bleeder resistance circuit that includes a first circuit S1 and a second circuit S2 connected in series to the first circuit S1. The first circuit S1 and the second circuit S2 are formed on one side of a substrate (not shown), for example. An insulating film (not shown) is formed between the substrate and the first circuit S1 as well as the second circuit S2. The first circuit S1 includes a plurality of fixed resistance elements Rn (n is a natural number) connected in series. The fixed resistance elements Rn are formed, for example, by polycrystalline silicon resistors with a desired resistance value. The fixed resistance elements Rn are connected by a plurality of electrical connection portions Cn. An upstream side of the first circuit S1 is connected, for example, to a first electrode C0 on a high potential side of the circuit. The first electrode C0 is, for example, a positive power source (VDD) of the circuit composed of a field effect transistor.

On an upper layer side of the first circuit S1, a first cover portion K1 that covers the first circuit S1 is formed. The first cover portion K1 includes, for example, a plurality of first metal films Bn individually provided for each of the fixed resistance elements Rn. Each of the first metal films Bn is formed of, for example, an Al—Si—Cu laminated film, an Al—Cu laminated film, or the like. Adjacent first metal films Bn are separated from each other. An insulating film (not shown) is formed between the first circuit S1 and the first cover portion K1. An insulating layer (not shown) is formed on an upper layer side of the first metal film Bn.

The first metal film Bn is electrically connected in parallel to an electrical connection portion Cn−1 on its upstream side by an electrical wiring Wn. As a result, each of the first metal films Bn is electrically connected to each of the fixed resistance elements Rn to be equipotential. With the above configuration, the first metal film Bn is provided individually for each of the fixed resistance elements Rn in the first circuit S1, such that each of the fixed resistance elements Rn and each of the first metal films Bn is equipotential, and variations in the resistance value of each of the fixed resistance elements Rn can be prevented.

The second circuit S2 is connected in series to a downstream side of the first circuit S1. The second circuit S2 includes a plurality of variable resistance elements Vm (m is a natural number) connected in series. A downstream side of the second circuit S2 is connected to a second electrode Cx on a low potential side of the circuit. The second electrode Cx is, for example, a negative power source (VSS) of the circuit composed of a field effect transistor. The voltage value of the negative power source may be any value. The downstream side of the second circuit S2 is connected to a ground side.

The variable resistance element Vm is formed of materials such as a polycrystalline silicon resistor, for example. The variable resistance element Vm is configured to be reversibly changeable to a low resistance state or a high resistance state based on voltage input. On an upper layer side of the second circuit S2, a second cover portion K2 that covers the second circuit S2 is provided. The second cover portion K2 is formed on the same layer as the first cover portion K1. The second cover portion K2 includes a second metal film D electrically connected in parallel to the plurality of variable resistance elements Vm. An insulating film (not shown) is formed between the second circuit S2 and the second metal film D. An insulating layer (not shown) is formed on an upper layer side of the second metal film D.

The second metal film D is electrically connected in parallel to the second electrode Cx on its downstream side by an electrical wiring WE. As a result, the second metal film D is electrically connected to the second circuit S2 to be equipotential. The second metal film D is formed, for example, by an Al—Si—Cu laminated film, an Al—Cu laminated film, or the like. Since the second circuit S2 is continuously covered by the second metal film D, hydrogen entry can be prevented in the manufacturing process. The second circuit S2 is connected to the second electrode Cx to be equipotential with potential of the substrate.

The second metal film D is connected to the second electrode Cx to be equipotential with the potential of the substrate. As a result, the second circuit S2 and the second metal film D are electrically connected to be equipotential. Since the second circuit S2 is continuously covered by the second metal film D, hydrogen entry can be prevented and the deterioration in the accuracy of the resistance value of the variable resistance element Vm can be suppressed.

An output electrode Q that takes out an output voltage Vout divided at the electrical connection portion Cn−1 is connected to the electrical connection portion Cn−1 of the first circuit S1. The output voltage Vout may be adjusted by adjusting the resistance value of the variable resistance element Vm in the second circuit S2. The output electrode Q may be connected to an electrical connection portion at any position among the plurality of electrical connection portions connecting between the plurality of fixed resistance elements in the first circuit S1 and output the output voltage. With the above configuration, in a case that different supply voltages VDD and VSS (VDD>VSS) are received at the upper layer side of the first circuit S1 and the downstream side of the second circuit S2 and a potential difference occurs, the first circuit S1 and the plurality of first metal films Bn are equipotential, and the second circuit S2 and the second metal film D are equipotential.

As described above, according to the semiconductor device 1, since the plurality of first metal films Bn are individually electrically connected to each of the plurality of fixed resistance elements Rn in the first circuit S1, variations that occur in the plurality of fixed resistance elements Rn can be reduced. According to the semiconductor device 1, in the second circuit S2 where the effect of hydrogen entry is greater than in the first circuit S1, by electrically connecting the second metal film D that covers all of the plurality of variable resistance elements Vm, hydrogen entry can be prevented and deterioration in the accuracy of the resistance value of the variable resistance element Vm can be suppressed.

According to the semiconductor device 1, since the configuration of the first cover portion K1 and the second cover portion K2 is changed according to the type of resistance elements that constitute the first circuit S1 and the second circuit S2, variations in the resistance value due to hydrogen entry can be reduced while the device configuration and manufacturing process can be simplified.

Modification

Hereinafter, a modification of the semiconductor device 1 will be described. In the following description, the same names and reference numerals are used for the same configurations as in the above embodiment, and redundant descriptions are omitted as appropriate.

Figure 2:
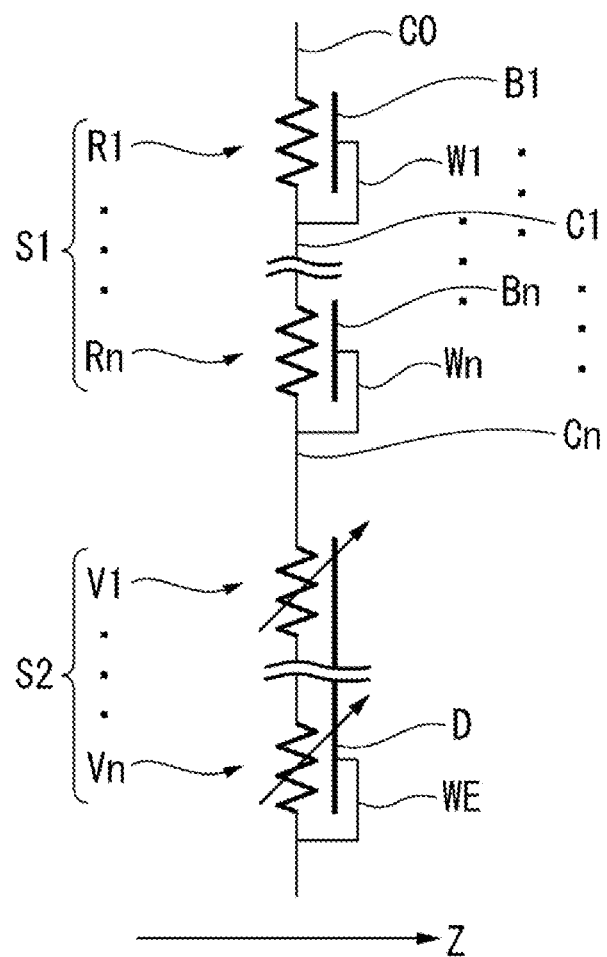
FIG. 2 is a diagram illustrating the configuration of a semiconductor device according to a modification.

As shown in FIG. 2, in a semiconductor device 1A according to the modification, each of the first metal films Bn may be connected to the electrical connection portion Cn on the downstream side of the corresponding fixed resistance element Rn. As a result, each of the fixed resistance elements Rn and the corresponding first metal film Bn are equipotential, and the variations in the resistance value that occur in each of the fixed resistance elements Rn can be reduced.

Figure 3:
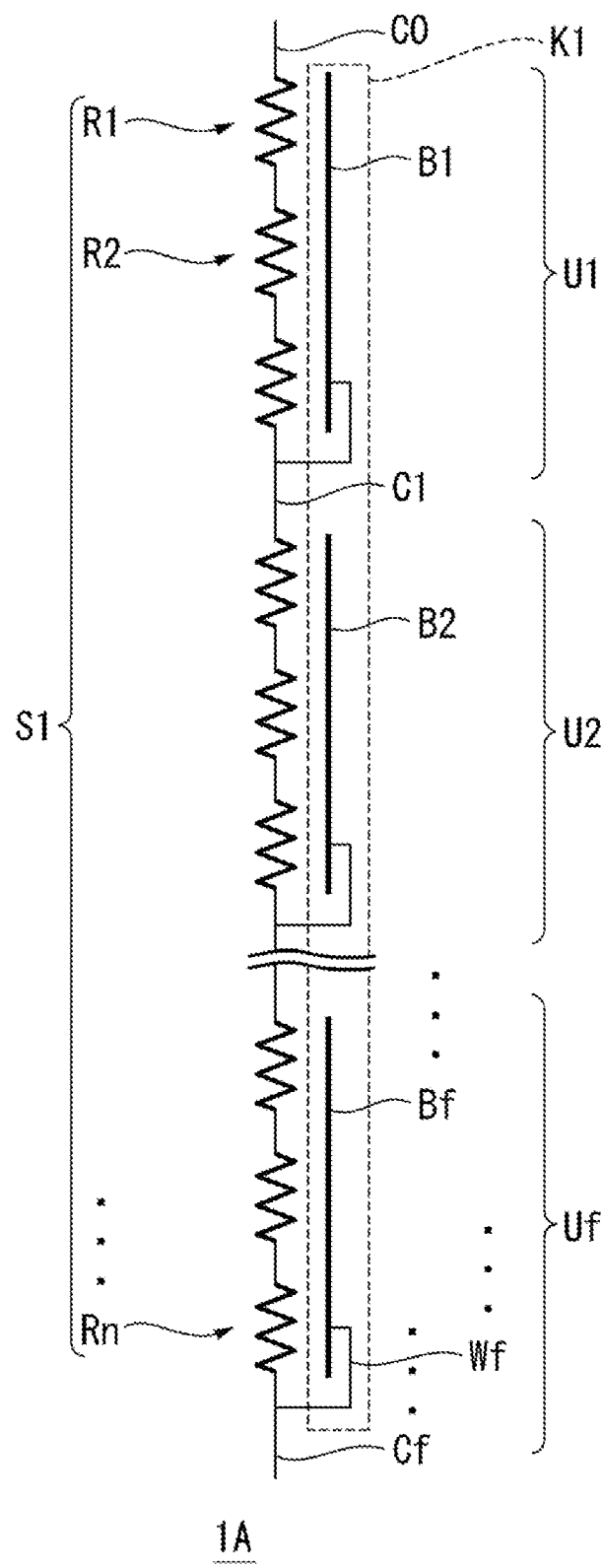
FIG. 3 is a diagram illustrating the configuration of a semiconductor device according to a modification.

As shown in FIG. 3, in the first circuit S1, the first cover portion K1 may include two or more first metal films Bf electrically connected, correspondingly, to units Uf (f is a natural number) having any number of fixed resistance elements Rn. The number of fixed resistance elements Rn included in each unit Uf may or may not be equal. Thus, at least two first metal films Bf are provided. By providing the first metal film Bf for each unit Uf, the number of electrical wirings Wf electrically connecting the first metal film Bf to the unit Uf can be reduced compared to the case where the first metal film Bn is provided for each of the fixed resistance elements Rn, and the device configuration and manufacturing process can be simplified.

Moreover, the second circuit S2 may be connected not only in series to the downstream side of the first circuit S1 but also to a VDD side on the upstream side. The second circuit S2 may be connected to any position among the electrical connection portions Cn between the plurality of fixed resistance elements Rn. Further, the connection position of the second circuit S2 may be changed according to the output voltage.

Although one embodiment of the present invention has been described above, the present invention is not limited to the above embodiments, and may be modified as appropriate to the extent not departing from the intent of the invention. It is also possible to replace the components in the above-described embodiment with well-known components to the extent that it does not depart from the purpose of the invention, and the above-described modifications may be combined as appropriate.

REFERENCE SIGNS LIST 1, 1A Semiconductor device
Bf, Bn First metal film
C0 First electrode
Cn Electrical connection portion
Cx Second electrode
D Second Metal Film
K1 First cover portion
K2 Second cover portion
Rn Fixed resistance element
S1 First circuit
S2 Second circuit
Uf Unit
Vm Variable resistance element

What is claimed is:

1. A semiconductor device, comprising:
a first circuit that comprises a plurality of fixed resistance elements connected in series;
a second circuit that comprises a plurality of variable resistance elements connected in series and that is connected in series to the first circuit;
a first cover portion that is provided on an upper layer side of the first circuit and that covers the first circuit; and
a second cover portion that is provided on an upper layer side of the second circuit and that covers the second circuit,
wherein the first cover portion comprises two or more first metal films electrically connected, correspondingly, to units having any number of the fixed resistance elements, and
the second cover portion comprises a second metal film electrically connected to the plurality of variable resistance elements.

2. The semiconductor device according to claim 1,
wherein the first cover portion comprises the plurality of the first metal films provided for each of the fixed resistance elements.

3. The semiconductor device according to claim 1,
wherein the second metal film is connected to be equipotential with a potential of a substrate.

4. The semiconductor device according to claim 2,
wherein the second metal film is connected to be equipotential with a potential of a substrate.

5. The semiconductor device according to claim 1,
wherein the first circuit is connected to a first electrode on a high potential side, and
the second circuit is connected to a second electrode on a low potential side.

6. The semiconductor device according to claim 2,
wherein the first circuit is connected to a first electrode on a high potential side, and
the second circuit is connected to a second electrode on a low potential side.

7. The semiconductor device according to claim 1,
wherein the second circuit is connected to a ground side.

8. The semiconductor device according to claim 2,
wherein the second circuit is connected to a ground side.

9. The semiconductor device according to claim 1,
wherein an output voltage is output from an electrical connection portion at any position among a plurality of electrical connection portions connecting between the plurality of the fixed resistance elements in the first circuit.

10. The semiconductor device according to claim 2,
wherein an output voltage is output from an electrical connection portion at any position among a plurality of electrical connection portions connecting between the plurality of the fixed resistance elements in the first circuit.

* * * * *